(12) United States Patent
Mund et al.

(10) Patent No.: US 8,119,502 B2
(45) Date of Patent: Feb. 21, 2012

(54) METHOD FOR PACKAGING COMPONENTS

(75) Inventors: Dietrich Mund, Obersuessbach (DE);
Volker Seidemann, Berlin (DE); Edgar Pawlowski, Stadecken-Elsheim (DE);
Ralf Biertuempfel, Mainz-Kastel (DE);
Bernd Woelfing, Mainz (DE); Frank Fleissner, Mainz (DE); Petra Auchter-Krummel, Vendershein (DE);
Ulf Brauneck, Gross-Umstadt (DE);
Joseph S. Hayden, Clarks Summit, PA (US); Ulrich Fotheringham, Wiesbaden (DE)

(73) Assignee: Schott AG, Mainz (DE)

( * ) Notice: Subject to any disclaimer, the term of this patent is extended or adjusted under 35 U.S.C. 154(b) by 450 days.

(21) Appl. No.: 12/306,848

(22) PCT Filed: May 24, 2007

(86) PCT No.: PCT/EP2007/004602
§ 371 (c)(1),
(2), (4) Date: Aug. 31, 2009

(87) PCT Pub. No.: WO2008/006418
PCT Pub. Date: Jan. 17, 2008

(65) Prior Publication Data
US 2010/0022053 A1    Jan. 28, 2010

Related U.S. Application Data

(60) Provisional application No. 60/819,705, filed on Jul. 10, 2006.

(30) Foreign Application Priority Data

Jul. 10, 2006  (DE) .......................... 10 2006 032 047
Nov. 14, 2006  (DE) .......................... 10 2006 053 862

(51) Int. Cl.
*H01L 21/00*    (2006.01)

(52) U.S. Cl. .............. 438/464; 438/26; 438/51; 438/55; 438/64; 438/68; 257/E21.599

(58) Field of Classification Search .................. 438/464, 438/26, 51, 55, 64, 68
See application file for complete search history.

(56) References Cited

U.S. PATENT DOCUMENTS

| 6,548,321 B1 * | 4/2003 | Sawyer | 438/50 |
| 6,661,080 B1 * | 12/2003 | Glenn et al. | 257/620 |
| 6,777,259 B2 * | 8/2004 | Silverbrook | 438/51 |

(Continued)

FOREIGN PATENT DOCUMENTS

JP    09 082741 A    3/1997

(Continued)

OTHER PUBLICATIONS

Yolaine Cussac, "International Application No. PCT/EP2007/004602 International Preliminary Report on Patentability", Jan. 20, 2009, Publisher: PCT, Published in: EP.

(Continued)

*Primary Examiner* — David Zarneke
(74) *Attorney, Agent, or Firm* — DeMont & Breyer, LLC (57) ABSTRACT

The invention relates to a method for the manufacture of packaged components. The invention is based here on the problem of facilitating the application of covers with lateral dimensions that are smaller than the lateral dimensions of the functional substrate. For this purpose, a plate-like cover substrate is mounted on a carrier substrate. Then, on the uncovered side of the plate-like cover substrate, trenches are inserted, so that a composite part is obtained with the carrier substrate and individual covering parts that are separated from each other by the trenches, but interconnected by the carrier substrate. The covering parts of the composite part are connected with a functional substrate with a plurality of components. Then, the connection of the covering parts is dissolved with the carrier substrate, and the carrier substrate is removed, so that a composite is obtained with the functional substrate and a plurality of covering parts that cover functional areas.

22 Claims, 6 Drawing Sheets

U.S. PATENT DOCUMENTS 7,074,638 B2 * 7/2006 Maeda et al. .................. 438/75
2001/0042902 A1 11/2001 Wakabayashi et al.

FOREIGN PATENT DOCUMENTS

WO 02/01634 A 1/2002

OTHER PUBLICATIONS

PCT International Search Report and Written Opinion PCT/EP2007/004602, dated Sep. 28, 2007.

* cited by examiner

METHOD FOR PACKAGING COMPONENTS

The invention relates generally to a method for packaging or encapsulating components, such as, particularly, electronic, and also optoelectronic, integrated circuits and/or microelectromechanic components. The method relates particularly to the manufacture of covers for components with functional substrate, whose lateral dimensions are greater than the lateral dimensions of the cover. The invention is particularly suited for the partial packaging of components in the wafer composite. In a packaging in the wafer composite, parts of the housing of the chips are applied already before the separation from the wafer.

In the state of the art, methods are already known by means of which a complete housing of the chips on the wafer plane is achieved. It is also known to apply already in the wafer composite balls of solder on the housed chips. With such a processed wafer, components can then be obtained directly by separation, and used, for example, as SMD components.

To cover the active sides or functional areas of the components, it is possible to connect, for example, cover wafers with the functional wafer, i.e., the wafer on which the components are defined. However, in some cases, cavities are needed that surround the functional areas of the components. Here one thinks, for example, of encapsulated microelectromechanical components where the mechanical elements require a certain freedom of movement. Moreover, a direct connection of a cover with the components on their functional areas can have a detrimental effect on their electronic and/or also on their optical functions, in the case of optoelectronic elements.

If a cover wafer is used for the encapsulation and then individual components are separated from the wafer composite with functional wafers and cover wafers by sawing, then, on the individual components, the covers present in each case substantially the same dimensions as those of the substrate separated from the functional wafer. In other words, the functional side of the chips or other components produced in the wafer composite are covered completely by the cover after the separation. However, this may be undesirable, for example, if the chips should be contacted on their functional side by wire bonding. In that case, the connection areas for the wires are then covered by the cover. To provide the chips with covers for the wire bonding, the so-called "pick and place" technique has been used to date, where individual housing parts are placed on the functional wafer and mounted. This technology, however, is very time-consuming, even in robot-assisted manufacture, and it drives up production costs.

Therefore, the invention is based on the problem of simplifying the application of covers with lateral dimensions that are smaller than the lateral dimensions of the parts that are separated from the functional substrate, such as, particularly, from a functional wafer.

For this purpose, the invention provides a method for manufacturing packaged components, in which a plate-like cover substrate is mounted on a carrier substrate, and then trenches are inserted on the uncovered side of the plate-like cover substrate, which divide the plate-like cover substrate, so that a composite part is obtained with the carrier substrate and individual covering parts that are separated from each other by the trenches, but interconnected by the carrier substrate, where the covering parts of the composite part are then connected with a functional substrate with a plurality of components, so that the trenches run along isolation areas on the functional substrate between functional areas of the components, and the covering parts cover the functional areas, and where the connection of the covering parts with the carrier substrate is then eliminated, and the carrier substrate is removed, resulting thus in a composite with the functional substrate and a plurality of covering parts that cover the functional areas. By an appropriate insertion of the trenches, the covering parts can be manufactured here in such a way that their lateral dimensions are smaller than the lateral dimensions of the parts that are later separated from the functional substrate for the manufacture of the components.

The invention here makes it possible to apply jointly as a composite all the desired covering parts for a functional substrate, such as, particularly, a functional wafer, and to mount them. The mounting is here not substantially more time-consuming than, for example, the mounting of a single-piece cover wafer. However, because the covering parts are elaborated by the insertion of the trenches, already before the separating of the components from the functional wafer, there are substantially no limitations with regard to their lateral dimensions in comparison to those of the functional parts that have been separated from the functional substrate. Accordingly, the covering part can be manufactured by the insertion of trenches in such a way that the covering parts present, at least in one direction along the side of the functional substrate onto which the covering parts are mounted, in each case a smaller dimension than the area between the two separating areas. In the case of a functional wafer, such as, for example, a semiconductor wafer with electronic, optoelectronic or microelectronic components, the areas between two separating areas are the semiconductor substrates of the individual chips that are manufactured by separating along the isolation areas.

In particular, the invention also makes it possible that, during the mounting of the covering parts, cavities are defined that surround the functional areas. This can be achieved particularly by a method in which, on the plate-like cover substrate, a structured intermediate layer is applied, which is structured so that frame- or ring-shaped areas of the cover substrate remain uncovered, and where a coating is then deposited on the side of the cover substrate that is provided with intermediate layer, and the intermediate layer is later removed. In the process, the areas of the coating that have been deposited on the intermediate layer are removed together with the intermediate layer so that the frame- or ring-shaped raised structures are maintained on the frame-shaped areas that have are not covered by the intermediate layer, on the cover substrate. In addition, on the uncovered side of the plate-like cover substrate, the trenches that divide the plate-like cover substrate are inserted in such a way that they run between the frame-shaped structures. The covering parts that have been manufactured in this way and are still mounted on the carrier substrate are then connected to the frame-shaped structure with the functional substrate, so that cavities delimited by the frame-shaped structures are defined, which surround the functional areas.

It is preferred for the insertion of the trenches to be carried out after the application of the frame-shaped structures. However, it is also conceivable to first insert the trenches and then manufacture the frame-shaped structures. A particularly suitable material for the frame-shaped structures is glass.

Glass is characterized by optical transparency, hardness and low gas permeability, which is particularly advantageous to achieve as hermetic as possible an inclusion of the functional areas in the cavities. Furthermore, gas can also be deposited by vaporization, i.e., a deposition by thermal evaporation of a target. Here it is preferred to use electron beam vaporization. Compared to other deposition methods, such as, for example, sputtering, vapor deposition is carried out at very high deposition rates. To achieve very large layers even with high deposition rates it has been found to be particularly advantageous here to use plasma ion assisted deposition (PIAD). In the process, simultaneously with the deposition by thermal vaporization of target material, an ion beam is directed on the surface to be coated.

To produce a structured intermediate layer, it continues to be preferred to apply a photoresist layer as intermediate layer and structure it photolithographically. In this way, particularly in connection with the manufacture of the frame-shaped structures by the deposition of glass, highly precise structured frames with flat surfaces can be produced. To facilitate the removal of the intermediate layer, it is advantageous furthermore for the coating to be deposited at a layer thickness that is smaller than the thickness of the structured intermediate layer.

This results in the intermediate layer at the margins of the structures remaining accessible even after the removal of the coating. In this way it is possible, for example, for solvents that are used to dissolve the intermediate layer, or reagents that act in another way, for example, by decomposing or swelling the intermediate layer, to penetrate at the margins of the structure into the intermediate layer.

If the functional substrate, such as, particularly, a functional wafer, is further processed in steps that are carried out in a vacuum or at least in a low-pressure atmosphere, a pressure difference can develop between glass that has been enclosed at the time of the connection of the functional wafer with the covering parts in the cavities, and the environment. Examples of such process steps are vacuum deposition of layers, for example, by vapor deposition, sputtering and plasma assisted chemical vapor phase deposition. To prevent an excessive pressure difference and the resulting forces, channels can be provided that connect the cavities with the environment and allow gas exchange. One possibility to achieve this is to produce frame-shaped structures that present a gap, so that, after the mounting of the covering parts and the removal of the support layer through the gaps, channels are formed by the gaps, which connect the environment with the cavity. The channels can then be closed later, particularly after additional process steps that are carried out in a vacuum.

Furthermore, one can advantageously include a protective gas in the cavities. Such a protective gas can be, for example, an anhydrous atmosphere. In this way one can, for example, prevent the condensation of water on the walls of the cavities. The protection gas can also be free of oxygen or oxygen-deficient, in order to be able to prevent or at least slow oxidation processes that can have a detrimental effect on the lifespan or the functionality of the components. Anhydrous nitrogen is an example of a suitable protective gas. If the cavities remain at first connected via channels, then the closing of the channels can occur in a protective gas atmosphere. If no channels are present, then the connection of the covering parts to the functional substrate can be carried out in such a protective gas atmosphere, for example, in anhydrous nitrogen.

According to a preferred embodiment of the invention, a glass substrate is also used as cover substrate. Such a substrate can function particularly as a window for optoelectrical components and simultaneously encapsulate functional areas with optical sensors and/or emitters. By means of such a transparent cover substrate, the covering parts can then also form particularly advantageously optical windows for the functional areas.

To produce covering parts that are smaller than the parts that are later elaborated from the functional substrate, appropriately wide trenches can be produced, which are wider than the isolation areas provided on the functional substrate. The isolation areas on the functional substrate, such as, particularly, on a semiconductor wafer, are generally predetermined by the cut width of the cutting tools used. In semiconductor manufacture, appropriate saws are used generally for that purpose. Here it may be possible to insert in each case pairs of parallel trenches, for the insertion of the trenches for the dividing of the covering parts, instead of using cutting tools with larger cut widths. As a result, provided the trenches are separated far enough from each other, additional parts are elaborated between the covering parts and between the pairs of areas of the covered substrate, which can then be removed later.

According to an embodiment of the invention, the covering parts are fixed to the functional substrate for the mounting. The hermeticity of an adhesive layer used for connection is sufficient in many cases, particularly for components for the home consumer market, to protect the components and to reach the desired lifespan. The use of the type of adhesive depends on the requirements associated with the adhesive connection. If an optically transparent cover substrate and/or transparent functional substrate is used, a UV-curable adhesive can be used, where, for that purpose, the composite with the cover substrate, respectively the covering parts manufactured therefrom, and with the functional substrate is irradiated with UV radiation to cure the adhesive, which radiation then reaches—through at least one of the substrates—the adhesive layer between the two substrates. If the functional substrate in the UV area is not transparent, which is particularly the case if a semiconductor wafer has integrated circuits as functional areas, and if a transparent cover substrate, such as, particularly, a glass wafer is used, then it is also particularly advantageous here if the carrier substrate on which the covering parts are still mounted during the fixing on the functional substrate is also transparent. In particular, one may use a glass substrate here.

The trenches are manufactured particularly advantageously by mechanical ablation, particularly by sawing or polishing, for example. In the process, the same tools can be used as for the later separation of the components from the functional substrate. The separation of the components in semiconductor manufacture is here also referred to as "dicing."

To achieve a reliable separation of the covering parts from the carrier substrate, it is advantageous moreover to insert trenches that reach partially into the carrier substrate. This is particularly preferred in connection with mechanical ablation, because one can then ensure in a simple way that the cover substrate is in each case divided completely by the inserted trenches.

In many cases, the components on the functional substrate present electrical connection parts on the side with the functional areas. Such connection sites can also be particularly bond pads for wire bonding for contacting electronic or optoelectronic components, such as, particularly, integrated electronic or optoelectronic components. According to a particularly preferred embodiment of the invention, in order to keep these bond pads uncovered, the covering parts are lifted off by trenches and applied to the functional substrate in such a way that the electronic connection sites are uncovered.

After the mounting of the covering parts on the functional substrate, it is then also possible, immediately thereafter, or after carrying out additional manufacturing steps, to carry out manufacturing steps for packaging individual components by separating the functional substrate along the isolation areas between the functional areas.

The invention is suitable particularly for the encapsulation of electronic, including particularly also optoelectronic, and/ or microelectronic components on wafers, and also particularly semiconductor wafers as functional substrates. In the case of electronic or opto-electronic components, the functional areas on the wafer are defined particularly by the circuits of the components, and in the case of microelectromechanical components also by the microelectromechanical parts.

The invention is explained in greater detail below using embodiment examples and in reference to the mounted drawing. Here, identical reference characters denote identical or similar parts.

In reference to FIGS. 1-11, process steps are described below for manufacturing a functional wafer with covering parts for covering functional areas. In the process, as a result of the covering with covering parts, cavities are also produced, against which the functional areas of the functional wafer abut and are thus surrounded by the cavities.

Figure 1:
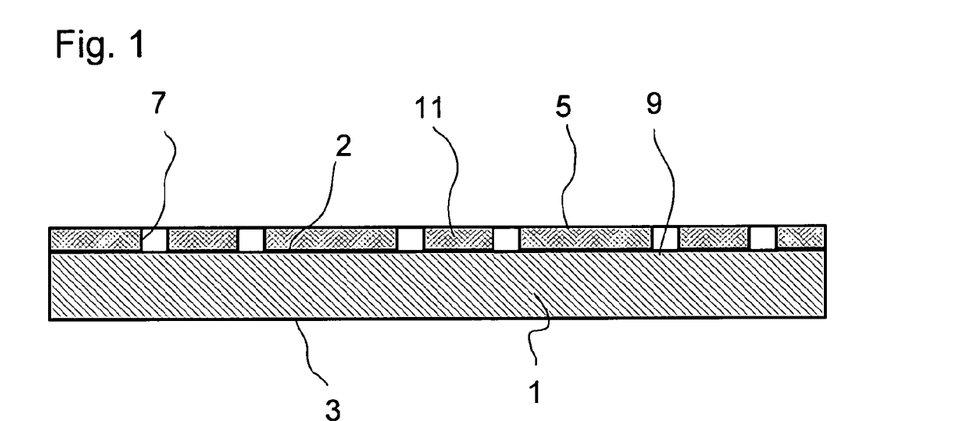
FIGS. 1-11: process steps for the manufacture of a functional wafer with covering parts.

FIG. 1 shows a cross-sectional view of a plate-like cover substrate in the form of a cover wafer 1 made of glass with sides 2, 3. The method for the encapsulation of the functional area is now based on applying a structured intermediate layer on the cover wafer 1, which is structured in such a way that frame-shaped areas of the cover substrate remain uncovered. Then a coating is deposited on the side of the cover wafer 1, which is provided with the intermediate layer, and the intermediate layer is then removed, so that the areas of the coating, which are deposited on the intermediate layer, are removed together with the intermediate layer, and frame-shaped structures are preserved on the frame-shaped areas that have been left uncovered by the intermediate layer, on the cover substrate.

On the uncovered side of the cover wafer 1, trenches that run between the frame-shaped structures are also inserted, dividing the cover wafer. The covering parts mounted on the carrier substrate are then connected on the frame-shaped structures with the functional wafer, so that cavities delimited by the frame-shaped structures are defined, enclosing the functional areas.

To manufacture a structured intermediate layer, a photoresist layer 5 is applied to side 2 of cover wafer 1. This layer is then structured, as shown in FIG. 1, photolithographically by illumination and development, in the process of which openings 7 are produced, which uncover frame- or ring-shaped areas 9 of side 2 of cover wafer 1 that isolate in each case areas 11 from the remaining photoresist layer 5.

Figure 2:
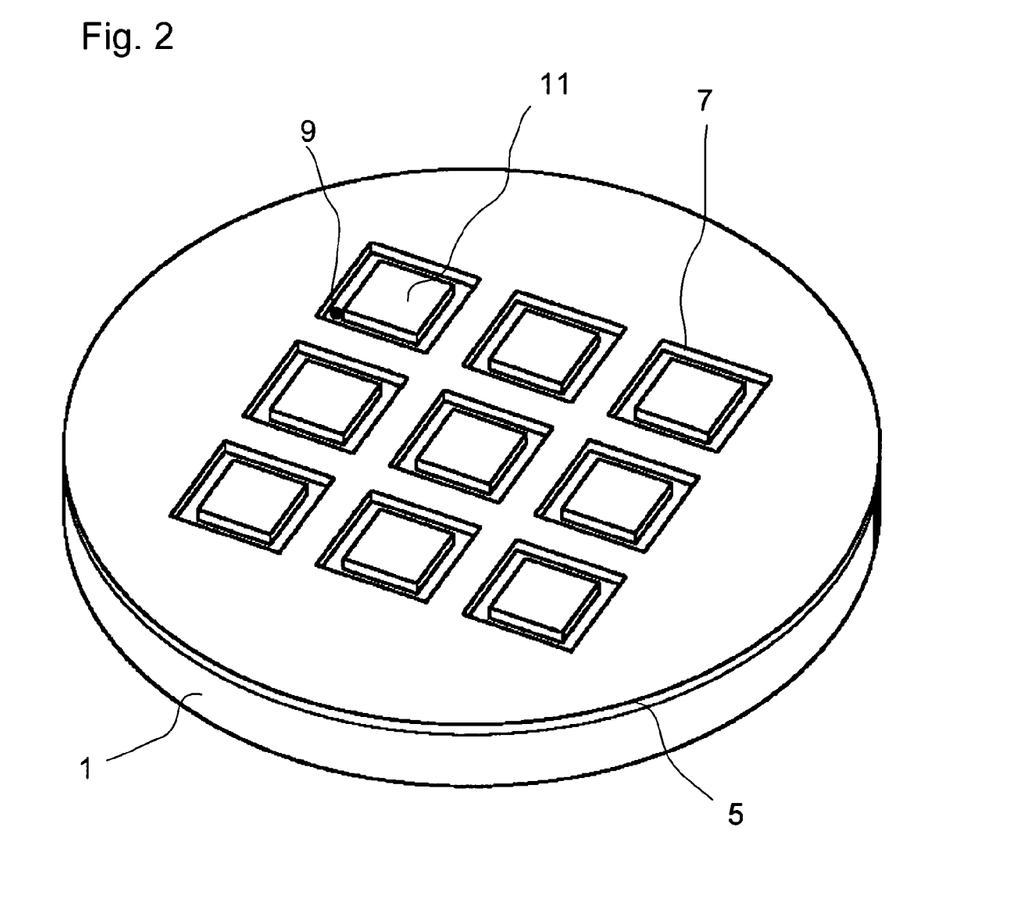

For clarification, FIG. 2 shows schematically a perspective view of the cover wafer 1 provided with a structured photoresist layer 5. In the example, nine such structures with uncovered frame-shaped areas are represented. Each of these structures is associated with a component on the functional wafer. However, it is evident to the person skilled in the art that in an actual functional wafer substantially more components are present in general, and therefore a correspondingly high number of frame-shaped areas 9 are produced on the cover wafer.

Subsequently, a layer is deposited on the side of the cover substrate provided with the intermediate layer. This layer is represented in the cross-sectional view of FIG. 3.

Figure 3:
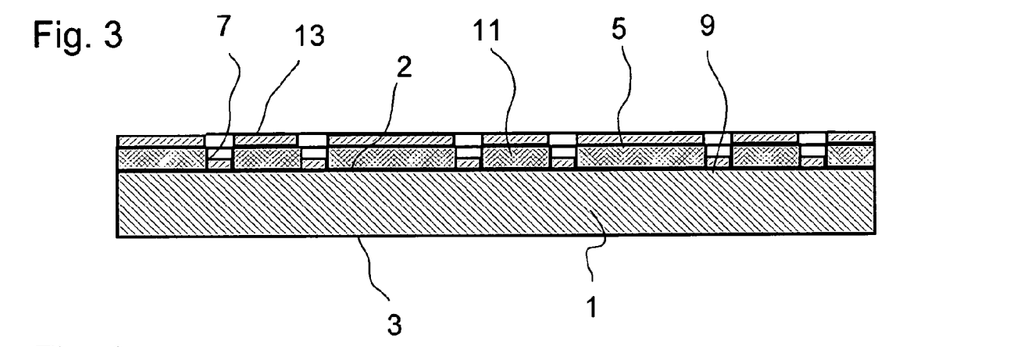

The coating is a glass layer produced by the deposition of thermally evaporated glass 13. The evaporation of the glass target used in the process here occurs preferably by electron beam vaporization. In this method, the heating is not performed via the contact with the other parts, as, for example, in the case of an indirectly heated crucible, rather by means of an electron beam that is directed on the glass target. The power can thus be concentrated by appropriate focusing of the electron beam on a small surface area. Thus, higher temperatures can be achieved on a small surface of the target. Because the vaporization rate depends nonlinearly on the temperature, very high vaporization rates and thus deposition rates can thus be achieved using only a small radiated power, and thus the substrate to be coated, here the cover wafer 1, can be kept relatively cool.

Glasses that present the following composition ranges, in wt %, have been found to be particularly suitable for use as vapor deposition glass:

| Components | Glass range 1 | Glass range 2 |
|---|---|---|
| $SiO_2$ | 75-85 | 65-75 |
| $B_2O_3$ | 10-15 | 20-30 |
| $Na_2O$ | 1-5 | 0.1-1 |
| $Li_2O$ | 0.1-1 | 0.1-1 |
| $K_2O$ | 0.1-1 | 0.5-5 |
| $Al_2O_3$ | 1-5 | 0.5-5 |

Preferred vapor deposition glasses from these groups are glasses from the company Schott having the following composition, in wt %:

| Components | Glass 1 | Glass 2 |
|---|---|---|
| $SiO_2$ | 84.1% | 71% |
| $B_2O_3$ | 11.0% | 26 |
| % $Na_2O$ | ≈2.0% | 0.5% |
| $Li_2O$ | ≈0.3% | 0.5% |
| $K_2O$ | ≈0.3% | 1.0% |
| $Al_2O_3$ | 0.5% | 1.0% |

The glasses that are used preferably possess particularly the properties listed in the following table:

| Properties | Glass 1 | Glass 2 |
|---|---|---|
| $\alpha_{20-300}$ $[10^{-6}K^{-1}]$ | 2.75 | 3.2 |
| Density (g/cm$^3$) | 2.201 | 2.12 |
| Transition point [° C.] | 562° C. | 466° C. |
| Refractive index | $n_D = 1.469$ | 1.465 |
| Water resistance class according to ISO 719 | 1 | 2 |
| Acid resistance class according to DIN 12 116 | 1 | 2 |
| Alkali resistance class according to DIN 52322 | 2 | 3 |
| Dielectric constant ε (25° C.) | 4.7 (1 MHz) | 3.9 (40 GHz) |
| tan δ (25° C.) | $45*10^{-4}$ (1 MHz) | $26*10^{-4}$ (40 GHz) |

The coating 13 is deposited at a layer thickness that is smaller than the thickness of the structured intermediate layer 5. Consequently, the margins of the intermediate layer 5 at the openings 7 remain accessible, because in the openings 7, respectively in the uncovered frame-shaped carriers 9 of the cover wafer 1, the intermediate layer 5 protrudes over the deposited glass layer 13. At these places, a solvent can then act on the intermediate layer 5, and dissolve the latter until they are detached. With the removal of the intermediate layer, areas of the glass layer 13 on the intermediate layer 5 are also detached. The use of this so-called "lift-off" process then leaves only those areas of the glass layer 13 deposited directly on the surface of the cover wafer 1. Accordingly, from the glass layer 13, respectively from the areas of this layer on the frame-shaped areas 9, which have been left uncovered, of the cover wafer 1, frame-shaped structures 15 are produced that surround in each case areas 16 of side 2 of cover wafer 1. This finishing step is represented in the cross-sectional view of FIG. 4 as well as for further clarification, in the perspective view of FIG. 5.

Figure 6:
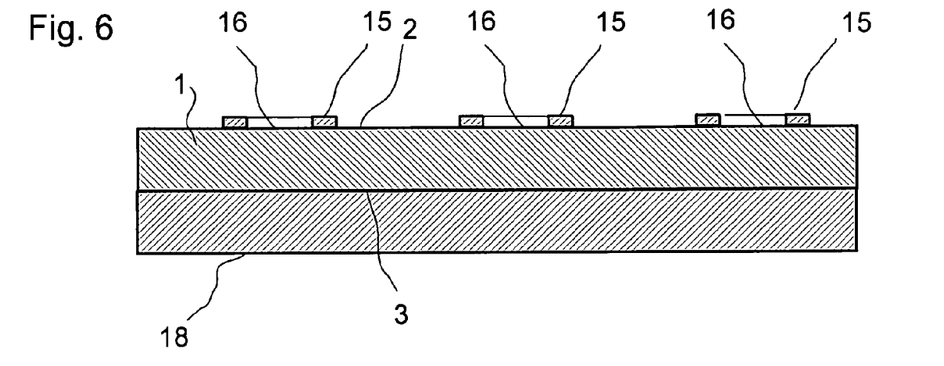

Then, as shown in the cross-sectional view of FIG. 6, a cover wafer 1 that has been prepared in this way is connected to the side 3 with a carrier substrate 18. The connection of the two substrates, here thus the cover wafer 1 and the carrier substrate 18, is designed to be detachable. For example, one can use, for this purpose, in general any suitable adhesive connection, whose adhesive strength is reduced as a result of the action of light and/or solvents and/or heat, and which allows the detachment of the carrier substrate 18.

Figure 7:
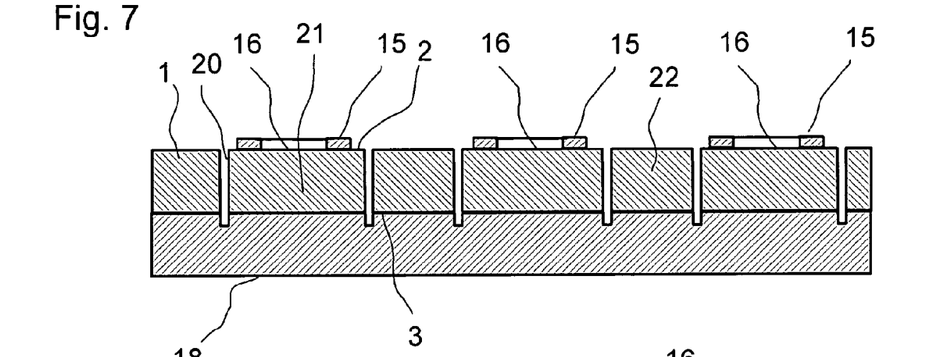

After the mounting of the cover substrate 1 of the carrier substrate 18, trenches 20 are inserted in the uncovered side 2 of the cover substrate 1. The cross-sectional view in FIG. 7 shows this step, as does the perspective view of FIG. 8. The trenches 20 are produced by sawing using a cutting tool as also used for detaching components made of semiconductor wafers in the manufacture of electronic components.

Figure 8:
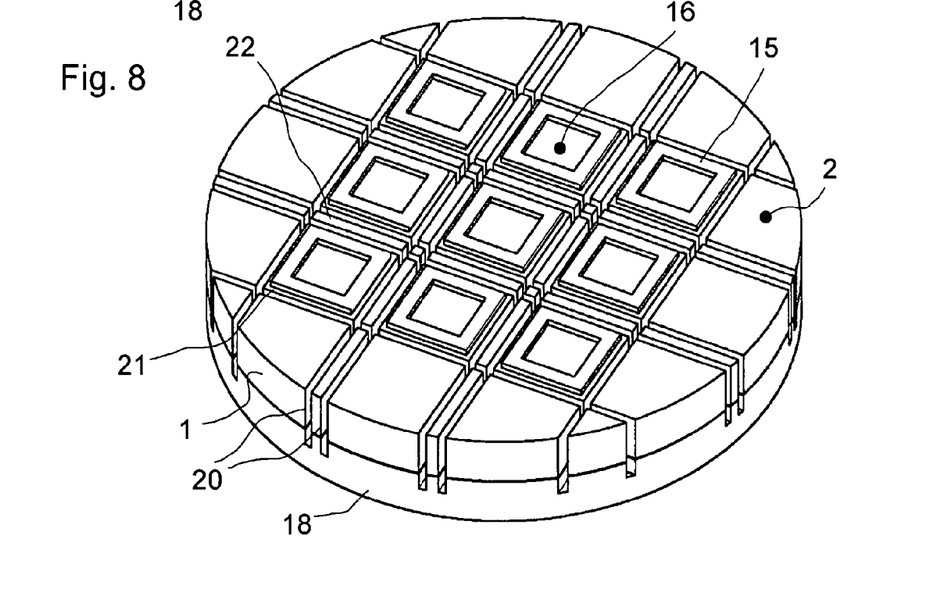

By the insertion of the trenches 20, which extend through the cover substrate 1, one obtains a composite part with the carrier substrate 18 and individual covering parts 21 that are separated from each other by the trenches 20, but interconnected via the carrier substrate 18, where in the examples shown each one of the covering parts 21 presents a frame-shaped structure 15.

As is apparent from FIGS. 7 and 8, the trenches 20 continue to be sawed to a depth such that they reach into the carrier substrate 18. In this way one ensures that the covering parts 21 are separated completely from the remaining parts of the cover substrate 1.

In addition, between the frame-shaped structures 15, individual trenches are not inserted, rather in each case pairs of parallel trenches 20 are inserted, so that here additional part 22 are present between the covering parts, and connected to the carrier substrate. Although individual trenches would already be sufficient to decompose the cover wafer 1 into individual parts, in this case the lateral dimensions of the covering parts 21 would however predetermine the width of the trenches, because the lateral positions are also fixed by the corresponding lateral positions of the components of the functional wafer to be encapsulated.

If there no longer are any such additional structures on one side of the frame-shaped structures 15, a single trench is also sufficient naturally, as also shown in FIGS. 7 and 8, on this side for the detachment of the covering parts from the remaining material of the cover wafer 1.

Alternatively to the separation of the covering parts 21 by pairs of parallel trenches 20, one could also insert appropriate wider individual trenches 20. To be able to insert the trenches 20 by dicing, for example, by sawing, the connection with the cover wafer 1 and with the carrier substrate 20 can be fixed, for example, on a support on the uncovered side of the carrier substrate 18 by means of an adhesive film, and the adhesive connection of the adhesive film can be detached after the sawing by irradiation with ultraviolet light.

Figure 9:
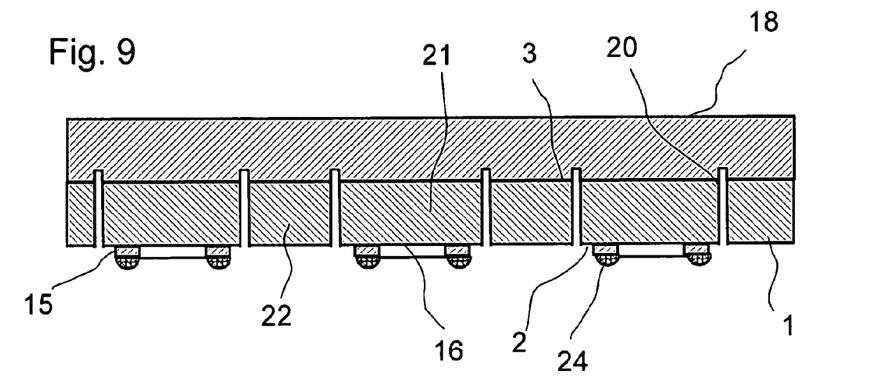
Figure 10:
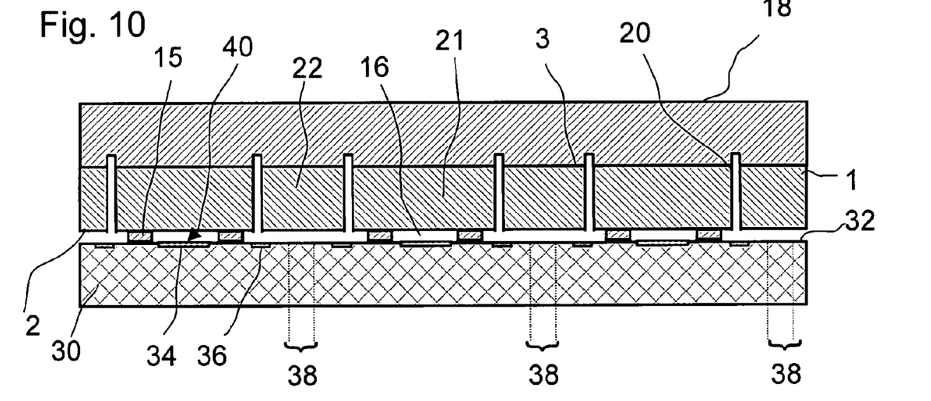

After the insertion of the trenches 20, the covering parts 20 are connected to a functional wafer. The cross-sectional views of FIGS. 9 and 10 show this step. First, as shown in FIG. 9, adhesive 24 is applied on the frame-shaped structures 15. For this purpose, an adhesive layer is applied on a surface, and the composite with the frame-shaped structures 15 is placed on this adhesive layer, so that the adhesive adheres to the raised frame-shaped structures. The application occurs preferably in the controlled atmosphere, which is particularly free of moisture and/or oxygen to prevent undesired reactions or condensation of moisture in the cavities, for example, the application can be carried out in a dry nitrogen atmosphere.

Subsequently, the composite with the covering parts 21 and with the carrier support 18 is oriented to form a semiconductor functional wafer 30, and, as shown in FIG. 10, applied on the functional wafer 30. The functional wafer 30 here comprises, in the examples shown, a plurality of functional areas 34 on or at the side 32 that is connected to the covering parts 21. The functional areas 34 can be particularly optoelectronic sensor switches.

For the electrical contacting of the functional area 34, contact surfaces 36 are also arranged on the side 32, and they can function particularly as bond pads for the wire bonding. Areas 38 between the functional areas 34 and contact surfaces 36 are provided as isolation areas. In the later detachment of individual components with functional areas and contact surfaces 36, the functional wafer 30 along these isolation areas 38 is separated.

As one can see using FIG. 10, the composite with the carrier substrate 18 and the covering parts 21 that are connected to it are placed on the functional wafer, and connected to the latter by means of the adhesive on the frame-shaped structures 15, in such a way that the trenches 20 along the isolation areas 38 on the functional wafer run between the functional areas 34 of the components, and the covering parts 21 cover the function areas 34. Because of the raised frame-shaped structures 15, the side 2 of the cover substrate 1, respectively of the covering parts 21 separated therefrom, here does not lie directly on the side 32 of the functional wafer 30. Rather, the side 2 of the cover substrate 1 is at a separation, due to the raised frame-shaped structures 15 applied to it, and the frame-shaped structures 15 form delimited cavities 40, against which the functional areas 34 abut, so that a functional area 34 is enclosed in each case by a cavity. The side of the cavities 40 that faces the functional areas 34 is formed here in each case by the areas 16 of side 2 of cover wafer 1, respectively the covering parts 21 separated therefrom.

If the covering parts 21 are placed as described above, the adhesive between the frame-shaped structures 15 and the side 32 of the functional wafer 30 can be cured, for example, by irradiation with UV light, by radiating UV light through the carrier substrate 18, the cover substrate 1, and the frame-shaped structures 15 on the adhesive places. This is possible particularly if glass is used as a material for all these parts. Using an adhesive that can be cured with light is advantageous, because in this way the processing type for curing the adhesive connection can be reduced considerably.

After the application of the covering parts, the carrier substrate 18 can then be removed. For this purpose, the connection between the carrier substrate 18 and the cover substrate 1, respectively the parts separated therefrom, is eliminated. For example, one can use an adhesive that can be eliminated under the action of UV light can be used. This is an example where the detachment of the carrier substrate and the curing of the adhesive connection between the covering parts 21 and the functional substrate can occur at least in part simultaneously. If the UV-curable adhesive is used for the adhesive connection between the covering parts 21 and the functional substrate, then, simultaneously with the curing of the adhesive connection between the covering parts 21 and the function wafer 30, the adhesive connection between carrier substrate 18 and the parts of the cover substrate 1 is eliminated under the action of the UV light.

Figure 11:
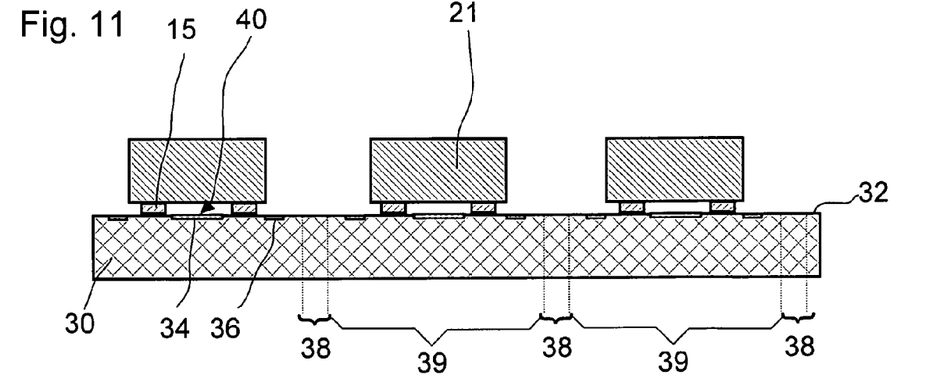

Because the parts 22 between the trenches 20 that are inserted in pairs do not have any connection with the functional wafer 30 after the detachment of the carrier substrate 18, they are removed as well. The result, a composite of the functional wafer 30 with the plurality of covering parts 21, which cover the functional areas 34 of the functional wafer 30, is shown in FIG. 11. The lateral dimensions of the covering parts 21 are, at least in one direction, smaller than the isolations, respectively the areas 39 of the functional wafer 30 between the isolation areas 38. In particular, the covering parts 21 are here separated by the manufacturing process in this way, and applied to the functional substrate, so that here too the electrical connection pads 36 are uncovered.

In the above-described embodiment example, the process steps do not all have to be carried out in the described sequence. Thus, the mounting of the cover wafer 1 on the carrier substrate 18 can also be carried out before the application and/or structuring of the photoresist layer 5 or the deposition of the glass layer 13 or the lift off of this glass layer 13. Similarly, it is also possible to carry out the insertion of the trenches 20 earlier than described above. Thus, the trenches can be inserted already before the application of the photoresist layer 5 and/or their structuring, or before the separation of the glass layer 13 or the lift off of the glass layer 13 together with the photoresist layer 5. It is advantageous here to insert the trenches 20 after the mounting of the cover wafer 1 on the carrier substrate 18.

Figure 12:
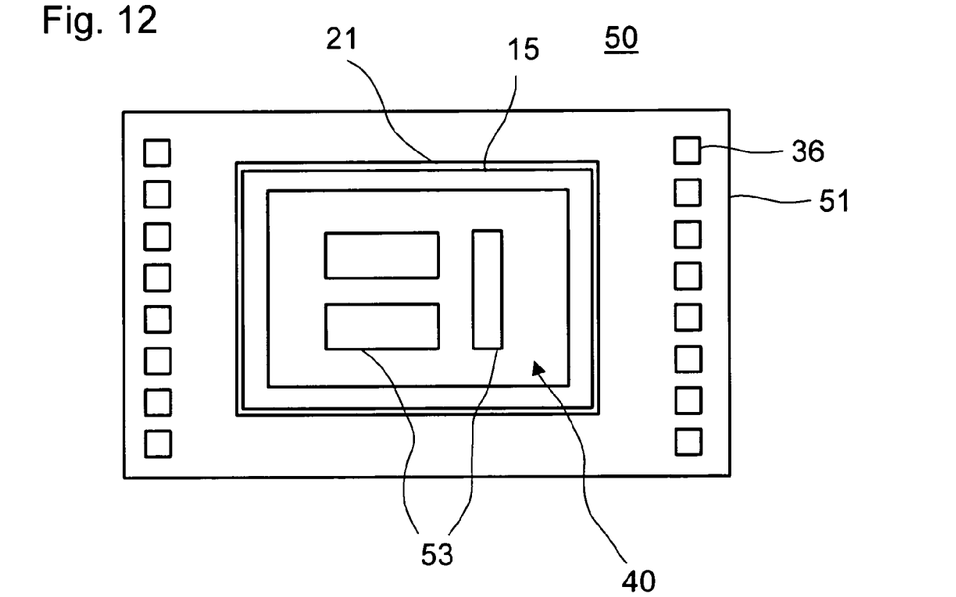
FIG. 12: in a top view a silicon ship manufactured by detaching the functional wafers.

FIG. 12 shows a top view of a silicon chip 50, as it can be obtained by separation from a corresponding functional wafer 30, as shown in FIG. 11, along the isolation areas 38. The semiconductor substrate 51 here corresponds accordingly to one of the areas 39 between the isolation areas 38 in FIG. 11. The functional area of the chips 50 comprises here, for example, one or more sensor areas 53. They can comprise, for example, an integrated CMOS or CCD sensor arrangement. The functional area, respectively here the sensor areas 53 are covered by the covering part 21 and they are located inside the frame-shaped structure 15. The sensor areas 53 are thus enclosed hermetically in the cavity 40 formed between the functional side of the chips 50 and the cover part. Any direct contact with other parts is prevented by the cavity, so that the functional sensor areas 53 cannot be affected by it. In particular, the glass covering part 21 forms an optical window for the sensor areas 53.

The connection pads 36 are in a position that is easily accessible, outside of the covering part, and can thus be used for the electrical contacting by wire bonding.

Figure 13:
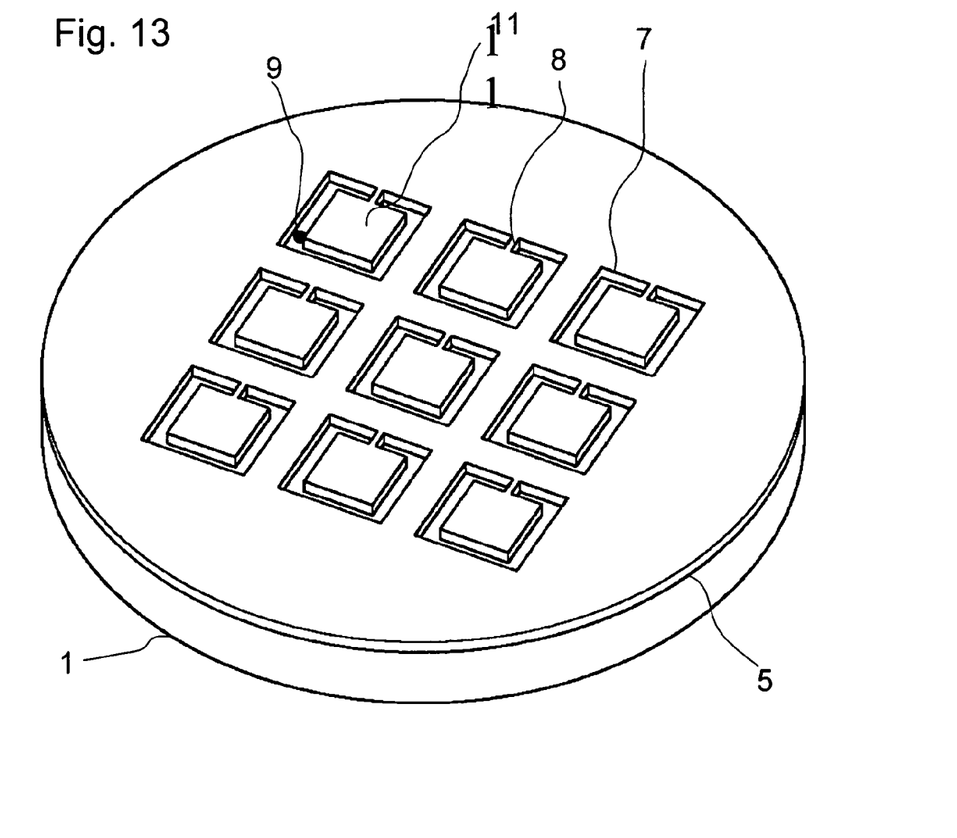
FIGS. 13-14: a variant of the process steps shown in FIGS. 1-11, in which covering parts with cavities are manufactured, which present a channel with a connection to the environment.
Figure 14:
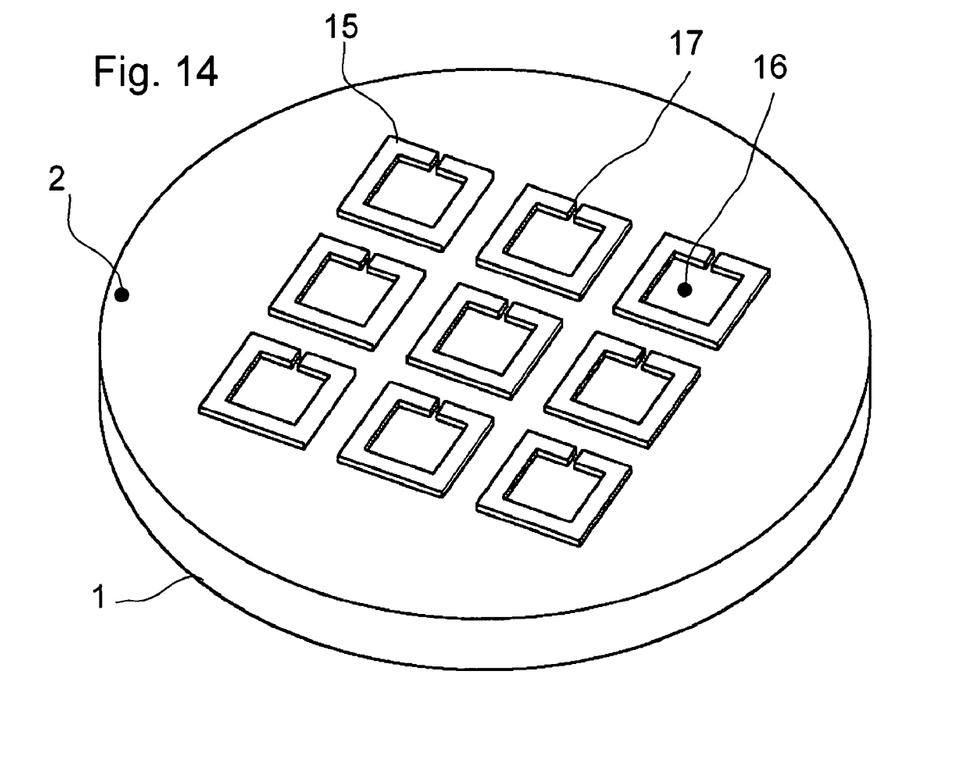

Using FIGS. 13-14, a variant of the process steps shown in FIGS. 1-11 is shown here, in which covering parts 21 with cavities 40 are produced, which presents a channel with connection to the environment.

FIG. 13 shows a perspective view of a processing step according to FIG. 2. In the example shown in FIG. 13 as well the cover wafer is provided with a photoresist layer 5, which is then structured by elimination and development, so that openings 7 are produced in the photoresist layer 5, which uncover frame-shaped areas 9 of side 2 of cover wafer 1. In contrast to the example shown in FIG. 2, however, no closed frame- or ring-shaped areas 9 are uncovered here. Rather, the inner areas 11 of the photoresist layer 5, which are surrounded by the ring-shaped openings 7, are connected by the bars 8 of the photoresist layer with the surrounding areas of the photoresist layer 5.

Figure 4:
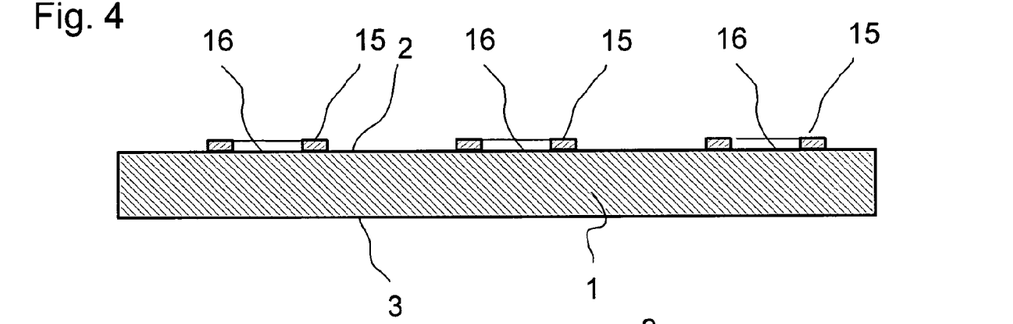
Figure 5:
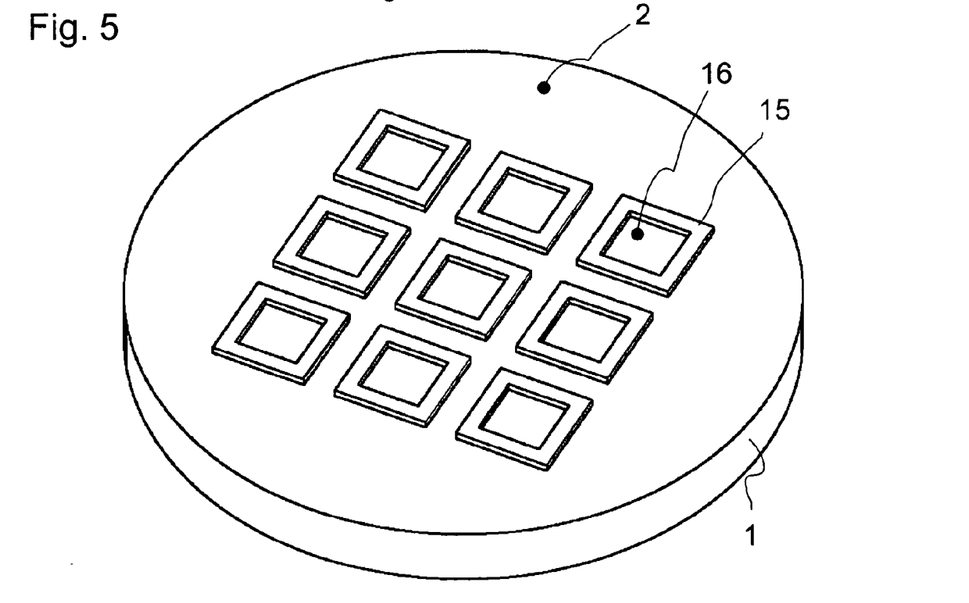

If a structured glass layer is prepared analogously to the process steps explained using FIGS. 3-5, then a cover wafer 1 is obtained with frame-shaped structures 15, as represented in the perspective view of FIG. 14. Because of the bars 8 in the photoresist layer, the frame-shaped structures 15 now present corresponding gaps at the location of the bars 8.

If the cover wafer is then processed further, as in reference to FIGS. 6-10, and connected with a functional wafer, then these gaps 17 form channels that connect the cavities 40 to the environment. This makes it possible to further process the composite, as shown in FIG. 11, also in a vacuum, for example, to apply layers by vacuum or low-pressure deposition, such as, particularly, sputtering, CVD or vapor deposition. Once these steps are completed, the channels can be closed, for example, by the external application of resin. This closure can be carried out in a controlled protective gas atmosphere, which may be, for example, water- and/or oxygen free, so that this protective gas is enclosed in the cavities.

It is evident to the person skilled in the art that the above-described embodiments must be understood as examples, and that the invention is not limited to them; instead, it can be varied in numerous ways without going beyond the scope of the invention.

The invention claimed is:

1. Method for the manufacture of packaged components, the method comprising:
    mounting a plate-like cover substrate on a carrier substrate;
    inserting trenches on the uncovered side of the plate-like cover substrate, which divide the plate-like cover substrate, so that a composite part is obtained with the carrier substrate and individual covering parts that are separated from each other by the trenches, or interconnected by the carrier substrate;
    connecting the covering parts of the composite parts to a functional substrate with a plurality of components, so that the trenches run along isolation areas on the functional substrate between functional areas of the components, and the covering parts cover the functional areas;
    eliminating the connection of the covering parts; and
    removing the carrier substrate, thus obtaining a composite with the functional substrate and a plurality of covering parts that cover functional areas.

2. Method according to claim 1, in which the trenches are inserted in such a way that in each case the covering parts present, in at least one direction along the side of the functional substrate, on which side the covering parts are applied, a smaller dimension than the area between two isolation areas.

3. Method according to claim 1, in which, during the application of the covering parts, cavities are defined that surround the functional areas.

4. Method according to claim 3, further comprising:
    on the plate-like cover substrate, applying a structured intermediate layer, which is structured so that framed-shaped areas of the cover substrate remain uncovered;
    depositing a coating on the side of the cover substrate that is provided with the intermediate layer;
    removing the intermediate layer, where the areas of the coating, which are deposited on the intermediate layer, are removed together with the intermediate layer, and raised, frame-shaped structures are obtained on the frame-shaped areas that are left uncovered by the intermediate layer, and where, on the uncovered side of the plate-like cover substrate, the trenches, which divide the plate-like cover substrate, are inserted in such a way that they run between the frame-shaped structures; and connecting, on the frame-shaped structures, the covering parts that are mounted to the carrier substrate with the functional substrate so that cavities are defined, which are delimited by the frame-shaped structures, and enclose the functional areas.

5. Method according to claim 4, characterized in that the coating for the preparation of the frame-shaped structures is deposited by vapor deposition of glass.

6. Method according to claim 4, characterized in that a photoresist layer is applied as intermediate layer and structured photolithographically.

7. Method according to claim 4, characterized in that frame-shaped structures are prepared that present a gap, so that after removal of the covering parts and the removal of the carrier substrate, channels are formed by the gaps, and connect the environment with the cavity.

8. Method according to claim 7, characterized in that the channels are closed, particularly after additional process steps that are carried out in vacuum.

9. Method according to claim 3, characterized in that protective gas is enclosed in the cavities.

10. Method according to claim 3, characterized in that the coating is deposited at a layer thickness that is smaller than the thickness of a structured intermediate layer.

11. Method according to claim 1, characterized in that a glass cover substrate is used.

12. Method according to claim 1, characterized in that the covering parts are separated from each other by pairs of parallel trenches.

13. Method according to claim 1, characterized in that the covering parts are fixed on the functional substrate for the mounting.

14. Method according to claim 13, characterized in that the covering parts are fixed on the functional substrate with a UV-curable adhesive.

15. Method according to claim 1, characterized in that the cover substrate is fixed on the carrier substrate by means of a UV-removable adhesive, and the adhesive is irradiated with UV light for the detachment of the carrier substrate from the cover substrate.

16. Method according to claim 1, characterized in that the cover substrate is mounted on a glass carrier substrate.

17. Method according to claim 1, characterized in that the trenches are produced by mechanical ablation.

18. Method according to claim 1, characterized in that trenches are inserted that extend partially into the carrier substrate.

19. Method according to claim 1, characterized in that the components present electrical connection sites on the side with the functional areas, where the covering parts are detached by trenches and applied on the functional substrate, so that the electrical connection sites are uncovered.

20. Method according to claim 1, characterized in that the individual components are prepared by separating the functional substrate along the isolation areas between the functional areas.

21. Method according to claim 1, in which electronic, optoelectronic or microelectromechanical components on a wafer are encapsulated with the covering parts.

22. Method according to claim 1, characterized in that the covering parts form optical windows for the functional areas.

* * * * *